United States Patent [19]

Ramachandran et al.

[11] Patent Number: 4,505,798
[45] Date of Patent: Mar. 19, 1985

[54] MAGNETRON SPUTTERING APPARATUS

[75] Inventors: Kovilvila Ramachandran, Ottawa; Enrico Giani, Orleans, both of Canada

[73] Assignee: Canadian Patents and Development Limited, Ottawa, Canada

[21] Appl. No.: 552,810

[22] Filed: Nov. 17, 1983

[30] Foreign Application Priority Data

Nov. 18, 1982 [CA] Canada ................................ 415872

[51] Int. Cl.³ .............................................. C23C 15/00
[52] U.S. Cl. .................................. 204/298; 204/192 R
[58] Field of Search ............................ 204/298, 192 R

[56] References Cited

U.S. PATENT DOCUMENTS 3,502,562  3/1970  Humphries .......................... 204/298
3,829,373  8/1974  Kuehnle .............................. 204/298
4,252,626  2/1981  Wright et al. ................... 204/192 R
4,297,189  10/1981 Smith et al. ......................... 204/298
4,404,263  9/1983  Hodes et al. ........................ 204/298

OTHER PUBLICATIONS

Hanak, Proc. 6th Internl. Vacuum Cong., 1974, Japan, J. Appl. Phys., Suppl. 2, Part 1, 1974; pp. 809-812.
Sinclair et al., Rev. Scient. Instruments, vol. 33, #7, 1962, pp. 744-746.
Vossen, Thin Film Processes; Academic Press; N.Y.; N.Y., 1978, pp. 134-139.

Primary Examiner—Arthur P. Demers
Attorney, Agent, or Firm—James C. Wray

[57] ABSTRACT

Magnetron sputtering apparatus is described in which the target cathode is constructed of one material, for example chromium, with one or more other materials deposited thereon.

A disc of chromium with nickel sectors is described as one target cathode to give a nickel to chromium ratio of 10 to 90 while rectangular and cylindrical targets are also described.

6 Claims, 4 Drawing Figures

U.S. Patent   Mar. 19, 1985   4,505,798
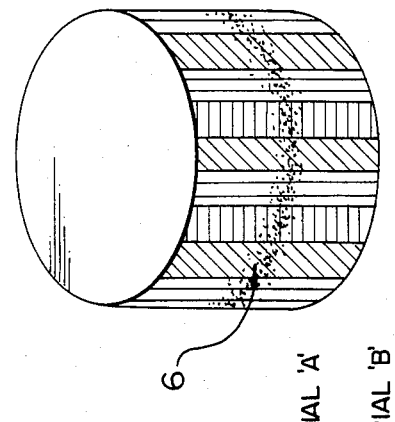
FIG. 2
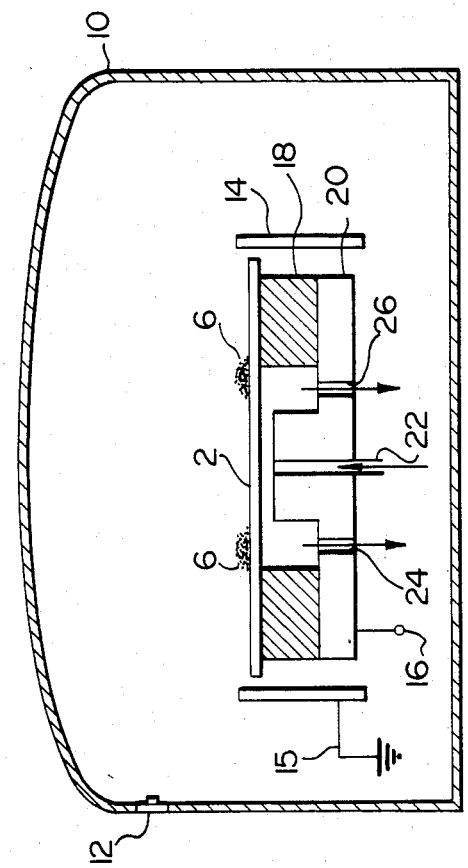
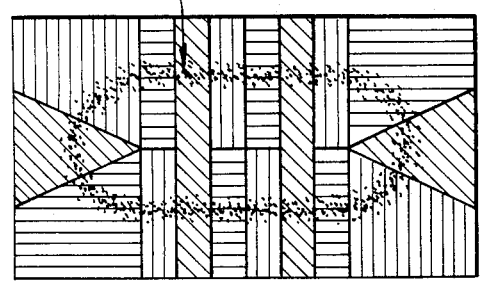
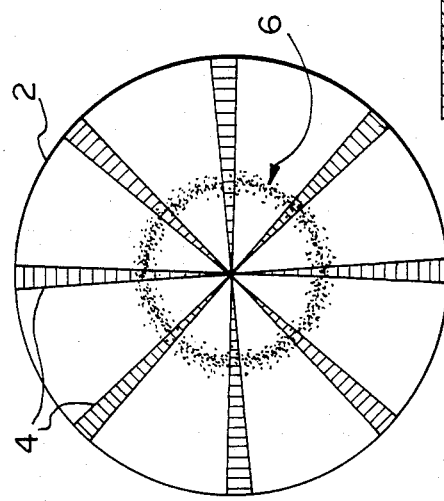
FIG. 1
FIG. 3
FIG. 4

MAGNETRON SPUTTERING APPARATUS

BACKGROUND OF THE INVENTION

This invention relates to an apparatus for depositing metal on a substrate by a cathode sputtering technique.

Sputtering refers to the removal of material from a surface due to particle bombardment and is an occurrence commonly observed at the cathode in a D.C. gas discharge. A gas, is admitted into an evacuated chamber containing anode and cathode electrodes. As discussed in U.S. Pat. No. 3,502,562, issued Mar. 24, 1970 to Richard S. Humphries, the positive ions are attracted to and bombard the negatively charged cathode resulting in a liberation of the cathode material. This cathode sputtering results in the disintegrated material leaving the cathode surface either as free atoms or in chemical combination with the residual gas molecules. Some of the liberated atoms may be deposited on the surfaces surrounding the cathode and this effect has been used to produce homogeneous thin films of elements, alloys or compounds on substrates suitably positioned within the evacuated chamber.

The cathode may be suspended from the top of the evacuated chamber but must be connected to a source of high negative potential.

An improved method of sputtering with which we have working involves the use of a magnetron for the vacuum deposition of metals, alloys, compounds and dielectrics. We have found that magnetron sputtering is advantageous over other forms of vaccum deposition, such as evaporation, in view of its ability to produce films of essentially the same composition as the starting material. Furthermore, high rates of deposition can be achieved, which are easily controllable during operation. However, magnetron sputtering requires special fabricated targets configured to suit the particular system. Preparation of such targets requires the target material of the appropriate composition to be in a solid, workable form which is not the case for the targets disclosed in the above-mentioned U.S. patent. Furthermore, it has been found that many materials of interest in vacuum deposition are difficult, if not impossible, to fabricate in suitable forms. One such common example is the Nickel Chromium (Ni-Cr) alloys which find extensive application in thin film technology.

Electrical properties of Ni-Cr over a wide range of alloy ratio (from 0 to 100%) are of interest in thin film resistor fabrication. In particular, films prepared with high Cr content have exhibited remarkable stability of resistance value against temperature variation, a feature that is of great value in microelectronics. But for a few standard alloys such as 80/20, 60/40 and 50/50 available in sheet form, Ni-Cr alloys are not generally easy to obtain or fabricate. As the Cr content increases the alloy becomes progressively hard and brittle, and loses workability by conventional rolling and milling operations.

One suggested technique for obtaining the required film composition is by using a two-gun sputtering method with two separated sputter sources operated simultaneously. In principle with this two-gun method, a substrate located in the region of overlap of emission from the two sources would collect the components in the proper ratio, determined by the operating parameters of the source. In practice, however, it has been found that considerable effort is required to obtain consistency of deposition over useful areas of substrate and to reproduce the same results from run to run.

SUMMARY OF THE INVENTION

It is an object of the present invention to provide an improved apparatus in which the above-mentioned disadvantages are reduced or substantially obviated.

According to one aspect of the invention there is provided a magnetron sputtering apparatus, including a chamber, a support for a cathode target, and a composite conductive cathode target comprising adjacent integral areas of different material to permit the simultaneous sputtering of said different material in an alloy ratio determined by the relative area thereof.

DESCRIPTION OF THE DRAWINGS

Embodiments of the present invention will now be described, by way of example, with reference to the accompanying drawings in which:

FIG. 1 is a diagrammatic representation of a composite cathode target according to one embodiment of the invention, FIG. 2 is a cross-sectional view of part of a magnetron device according to an embodiment of the invention for cooling a target cathode, FIG. 3 is a diagrammatic representation of a rectangular composite target according to another embodiment of the present invention, and FIG. 4 is a diagrammatic representation of a cylindrical composite target according to yet another embodiment of the present invention.

DESCRIPTION OF PREFERRED EMBODIMENTS

Referring to FIG. 1, the composite target cathode comprises a disc 2, having a diameter of 3" and 1/16" thickness. The disc 2 is of chromium (Cr) and several equal sectors 4 of nickel (Ni) material are distributed uniformly around the surface of the chromium disc 2. The ratio of nickel to chromium may, for example, be 10:90. The plasma ring formed during sputtering is identified as 6 in FIG. 1.

In FIG. 2, part of the magnetron sputtering apparatus is shown including a magnetron housing 10 and a magnetron sputter device 12. An anode shield electrode 14 is maintained at ground potential by way of connection 15 and located in the housing 10 together with the cathode target disc 2 (FIGS. 1 and 2) which is maintained at a potential between $-500$ and $-800$ volts by way of terminal 16. A magnet assembly 18 with pole piece 20 is provided as shown in FIG. 2.

Cooling of the magnetron system, including the target disc 2, is accomplished by circulating a cooling liquid behind the disc 2. It will be appreciated that a backing plate could be used if it is desirable to avoid direct contact with the target disc 2. The cooling fluid, e.g. liquid, enters the apparatus by way of inlet passage 22 and leaves by way of exit passages 24 and 26.

The magnetron geometry of the apparatus in FIG. 2 is such that all the sputtering is concentrated along a narrow circular band 6 just above the air gap of the magnet 18. Because of the circular symmetry of the magnetron apparatus, in use, the pattern of ion bombardment is the same for areas of Chromium (Cr) on disc 2 as for the nickel sectors 4 (FIG. 1). The sputtering coefficient of the two materials is known from standard data and this is the only other variable in the magnetron sputtering process.

It has been found that if there are a large number of nickel sectors, for example 8, uniformly spaced on the target disc 2 then the distribution of sputtered species at a distance of over three times the target diameter will be sufficiently uniform, yielding a component ratio given by the equation:

$$\frac{\% \text{ Cr}}{\% \text{ Ni}} = \frac{\text{area of Cr} \times \text{coefficient of Cr}}{\text{area of Ni} \times \text{coefficient of Ni}}$$

The sputtering coefficient is generally a function of operating potential but in most cases the ratio of coefficients varies only slightly over the practical range of operation. For example, the ratio for Ni-Cr is 1·13 at 500 volts and 1·15 at 600 volts.

It will be appreciated that there are a number of ways of attaching the nickel sectors 4 so as to form a composite target disc. For example in many situations spot welding, soldering and conductive epoxy bonding can be used. However, greater flexibility in forming the desired patterns can be achieved by using other techniques such as electroplating, chemical reduction plating, and vapour phase growth.

Electroplating was found to be the most convenient method for nickel-chromium and in this method a suitable backing plate (usually copper) was first electroplated with chromium to a thickness of several millimeters. Subsequently, the required mask pattern was printed on the chromium layer and nickel sectors of equal thickness were deposited over the chromium. It was found that targets with any ratio from 0 to 100% could be fabricated in this manner.

The technique described above for fabricating composite targets for the circular, planar magnetron can also be applied to the construction of targets having other shapes and arrangements of different materials. In FIG. 3, a target is illustrated which is rectangular in shape and which includes three different sputtering materials whilst in FIG. 4, a target is illustrated which is cylindrical in shape again includes three different sputtering material but arranged in a different pattern. In each case the plasma ring 6 is indicated.

In use a specimen, for example a substrate film, is suspended within the magnetron housing 10 and the appropriate cathode target is placed in position. The magnetron sputter device 12 is activated, with the cooling liquid flowing, so that bombardment of the target disc 2 results in the desired alloy coating on the specimen. Such apparatus was found particularly useful in thin film resistor fabrication.

It will be readily apparent to a person skilled in the art that a number of variations and modifications can be made without departing from the true spirit of the invention which will now be pointed out in the appended claims.

What is claimed is:

1. In a magnetron sputtering apparatus, including a chamber, a support for a cathode target, a magnet to provide an endless magnetic track whereby sputtering is concentrated in a closed band, and a composite conductive cathode target comprising adjacent integral sector areas of different material to permit the simultaneous sputtering of said different material in an alloy ratio determined by the relative area thereof.

2. Magnetron sputtering apparatus according to claim 1 including means for cooling said cathode target by cooling fluid.

3. Magnetron sputtering apparatus according to claim 1 or claim 2 wherein said cathode target is a disc of one material with sectors of another material superimposed thereon.

4. Magnetron sputtering apparatus according to claim 1 or claim 2 wherein said cathode target is a disc of chromium with eight sectors of nickel deposited thereon to provide a ratio of nickel to chromium of 10 to 90.

5. Magnetron sputtering apparatus according to claim 1 or claim 2 wherein said cathode target is a rectangular target of one material with a plurality of different sputtering materials deposited thereon.

6. Magnetron sputtering material according to claim 1 or claim 2 wherein said cathode target is a cylinder of one material with a plurality of different sputtering materials deposited thereon.

* * * * *